United States Patent
Ewer

[11] Patent Number: 5,886,397
[45] Date of Patent: Mar. 23, 1999

[54] CRUSHABLE BEAD ON LEAD FINGER SIDE SURFACE TO IMPROVE MOLDABILITY

[75] Inventor: Peter R. Ewer, Surrey, England

[73] Assignee: International Rectifier Corporation, El Segundo, Calif.

[21] Appl. No.: 915,926

[22] Filed: Aug. 21, 1997

Related U.S. Application Data

[60] Provisional application Nos. 60/025,458, and 60/025,832, Sep. 5, 1996.

[51] Int. Cl.⁶ .................................................. H01L 23/495
[52] U.S. Cl. .......................................... 257/667; 257/730
[58] Field of Search ................................... 257/667, 666, 257/673, 678, 787, 730

[56] References Cited

U.S. PATENT DOCUMENTS

| | | | |
|---|---|---|---|
| 4,280,132 | 7/1981 | Hayakawa et al. | 257/667 |
| 4,977,442 | 12/1990 | Suzuki et al. | 257/667 |
| 5,031,022 | 7/1991 | Yamamoto et al. | 361/421 |
| 5,202,577 | 4/1993 | Ichigi et al. | 257/667 |
| 5,285,104 | 2/1994 | Kondo et al. | 257/667 |

FOREIGN PATENT DOCUMENTS

| | | | |
|---|---|---|---|
| 000535882 | 4/1993 | European Pat. Off. | 257/667 |
| 363228656 | 9/1988 | Japan | 257/667 |
| 363302545 | 12/1988 | Japan | 257/667 |
| 401296651 | 11/1989 | Japan | 257/667 |
| 402310955 | 12/1990 | Japan | 257/667 |
| 403125467 | 5/1991 | Japan | 257/667 |
| 404179260 | 6/1992 | Japan | 257/667 |
| 2027990 | 2/1980 | United Kingdom . | |
| 2204824 | 11/1988 | United Kingdom . | |

Primary Examiner—Olik Chaudhuri
Assistant Examiner—Nathan K. Kelley
Attorney, Agent, or Firm—Ostrolenk, Faber, Gerb & Soffen, LLP

[57] ABSTRACT

A surface mount semiconductor package employs locking elements for locking a plastic housing to a metal pad on which a semiconductor device is mounted. The package includes terminals having elongated crushable beads on their side surfaces adjacent the portions of the terminals just outside the plastic housing. The beads are crushed inwardly by a molding tool when it closes to provide a seal which prevents the molding plastic from bleeding out and over the sides of the terminals which extend beyond the housing and which could interfere with solder connection to the terminals.

7 Claims, 10 Drawing Sheets

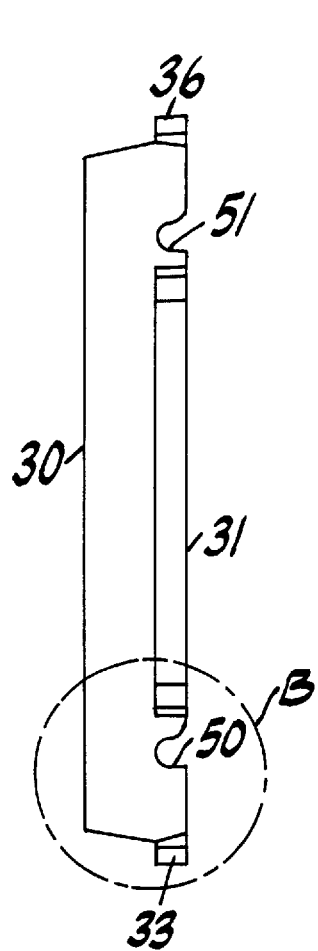
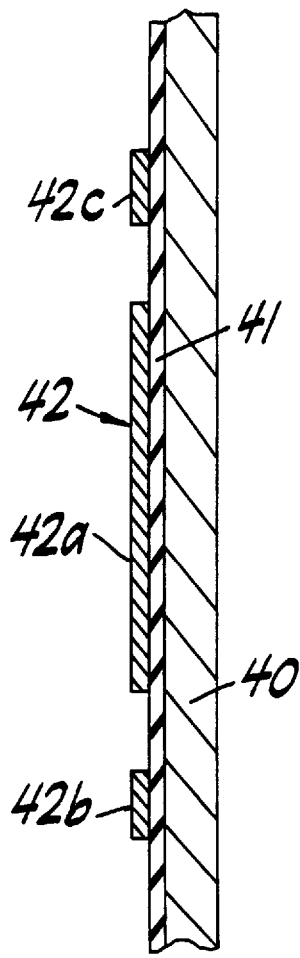
FIG. 3  FIG. 5
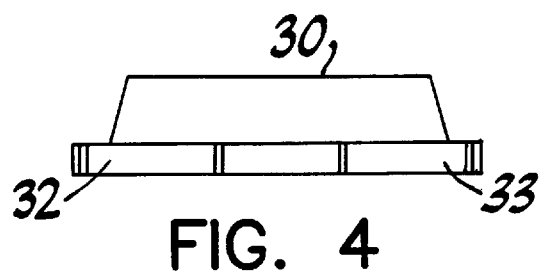
FIG. 4

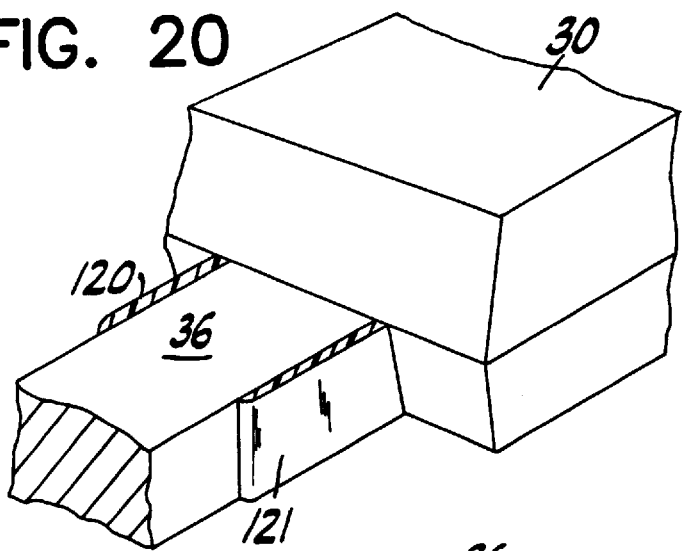
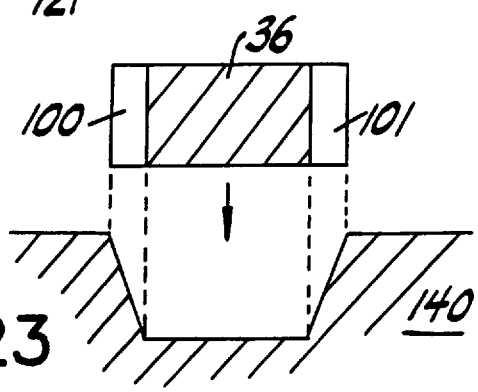
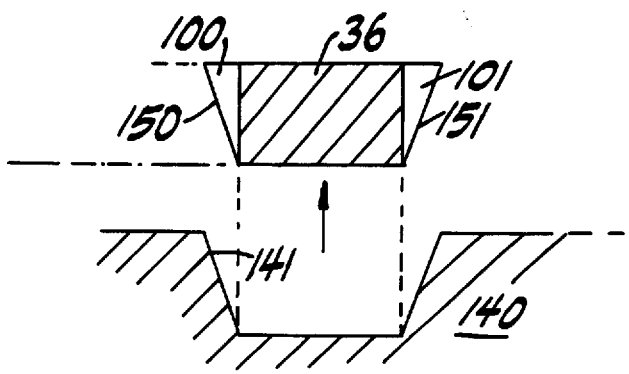

CRUSHABLE BEAD ON LEAD FINGER SIDE SURFACE TO IMPROVE MOLDABILITY

CROSS REFERENCE TO RELATED APPLICATIONS

This application is based on and claims priority to: (i) U.S. Provisional Patent Application Ser. No. 60/025,458, filed Sep. 5, 1996, entitled CRUSHABLE BEAD ON LEAD FINGER SIDE SURFACE TO IMPROVE MOLDABILITY; and (ii) Provisional Patent Application Ser. No. 60/025,832, filed Sep. 5, 1996, entitled IMPROVED SURFACE-MOUNT HIGH POWER SEMICONDUCTOR PACKAGE AND METHOD OF MANUFACTURE.

FIELD OF THE INVENTION

The present invention relates to semiconductor device packages and lead frames therefor, and more specifically relates to a high power semiconductor device adapted for surface mounting.

BACKGROUND OF THE INVENTION

Packages for high power semiconductor devices which can be surface mounted on an insulated metal substrate (IMS) or other flat support board surface are well known. One such package is shown in U.S. patent application Ser. No. 08/583,219, filed on Jan. 4, 1996, entitled SURFACE-MOUNT SEMICONDUCTOR PACKAGE which is incorporated herein by reference. These devices are very well adapted for surface mounting to the conductive patterns of flat support boards such as an IMS structure (a thick copper or aluminum substrate covered by a thin insulation film which has a thin patternable copper or other conductive solderable upper surface).

The present invention is an improvement of that device, making it more efficient and more easily manufacturable.

SUMMARY OF THE INVENTION

In accordance with the invention, there is provided a novel lead frame which can receive one or more semiconductor die such as power IGBT die, IGBT die, Schottky diode die and mixtures thereof on a central, flat pad section. The die are interconnected by the pad at their bottom surfaces, and at their tops by appropriate wire bonds. The lead frame has two power terminals, which may be interconnected at two adjacent corners of a rectangular package. The power terminals are accessible for connection externally of a flat plastic molded housing which encloses the top and sides of the central lead frame pad. A plurality of control pins or terminals, which initially are a part of the lead frame but are isolated from the heat sink pad after molding of the housing, extend from the side of the housing which is opposite the side containing the power terminal.

There are at least two closely spaced control terminals or pins which can be wire bonded to the gate and cathode or current sense terminals of the die within the housing. A remote third terminal (from the closely spaced first and second control terminals) is also available for connection to some other terminal, for example, the gate terminal of a thyristor die if such a die is contained within the housing.

The lead frame is preferably a single gauge conductive sheet. The terminals extending through the borders of the molded housing can be partially vertically offset to provide an improved plastic lock to the lead frame. The bottom surfaces of the terminals and the lead frame pad are in a common plane. The main heat sink pad can have parallel slots therethrough on opposite sides of the die on the pad to provide a further plastic lock to the molded housing. Shallow dovetail grooves can extend from an interior edge of these slots to also provide improved plastic locking.

The surface of the pad may have a waffled or dimpled surface to improve soldering of the bottom die surface electrodes to the pad. In accordance with a feature of the invention, the bottom surface of the pad which is to be surface mounted to a heat sink or conductive pattern of an IMS board can also be waffled to improve the solder down of the pad to the heat sink and to avoid solder voids due to a concavity in the lead frame bottom.

The bottom of the insulation housing is also provided with washing grooves which extend fully across the width of the package and are parallel to the sides containing input and output terminals and are located between the terminals and the pad. These grooves increase the surface tracking distance between the terminals and the pad and allow washing out of solder flux during solder down.

In accordance with a further feature of the invention, short shallow shelves extend from the bottom ends of the grooves and across the width of the housing bottom to improve the flux washing function.

As previously described, the various terminal pins are partly vertically sheared or offset to improve the plastic lock. In accordance with a further feature of the invention, the partially rounded edge of the offset region is provided with a small square notch or stepped corner to give a sharp edge to prevent the bleeding of plastic over the bottom surfaces of the terminal during molding.

As a further feature of the invention, the terminals are formed with elongated crushable beads at their side surfaces adjacent the portions of the terminals just outside the plastic housing. These beads are crushed inwardly by the molding tool when it closes, to provide a seal which prevents the molding plastic from bleeding out and over the sides of the terminals which extend beyond the housing and which could interfere with solder connection to the terminals.

As a still further feature of the invention, an integral lead frame bar connects the power input terminals at the two corners of the housing and internally of the housing. Wire bonds from the die within the housing are made to this single bar which is contained within the housing. The bar improves the wire bond connection and also acts as a plastic lock to the housing.

Other features and advantages of the present invention will become apparent from the following description of the invention which refers to the accompanying drawings.

BRIEF DESCRIPTION OF THE DRAWINGS

For the purpose of illustrating the invention, there is shown in the drawing a form which is presently preferred, it being understood, however, that the invention is not limited to the precise arrangement and instrumentality shown.

FIG. 3 is a side view of the package of the preferred embodiment of the invention.

FIG. 4 is an end view of the main power terminal end of the package of the preferred embodiment of the invention.

FIG. 5 is a cross-sectional view of an IMS support board to which the package of FIGS. 1 to 4 can be mounted.

FIG. 9 is an enlargement of circled area "A" in FIG. 7.

FIG. 20 shows a prior art structure in which sacrificial beads are not provided on the terminals which extend through the plastic housing.

FIG. 23 shows the mold and terminal before molding.

FIG. 24 shows the mold and terminal after molding.

DETAILED DESCRIPTION OF THE DRAWINGS

Figure 2:
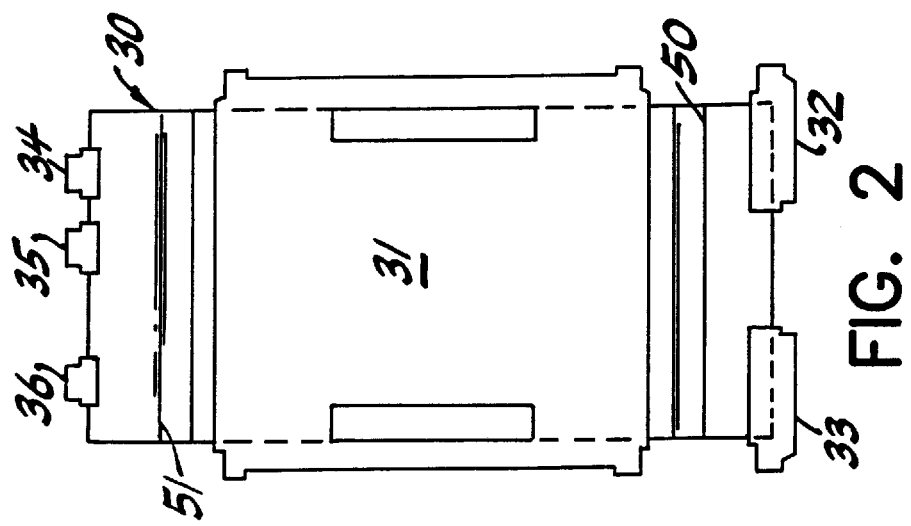
FIG. 2 is a bottom view of the package of the preferred embodiment of the invention.
Figure 1:
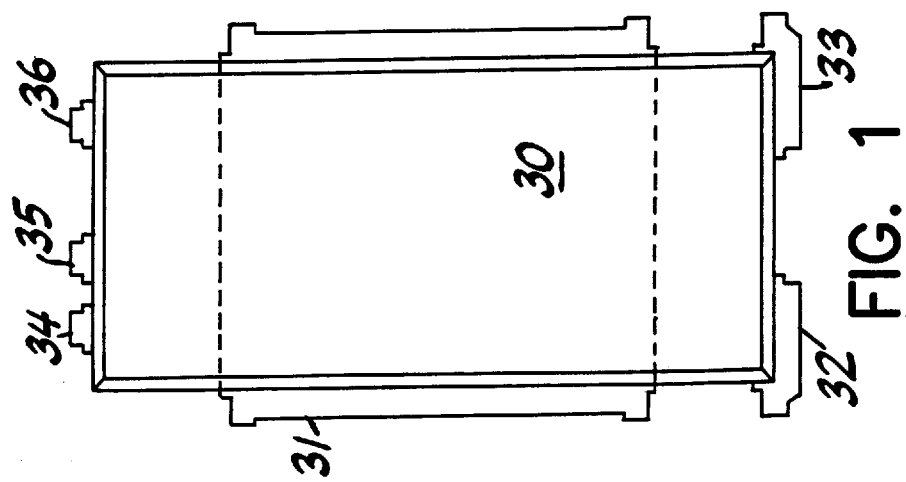
FIG. 1 is a top view of the package of the preferred embodiment of the invention.

Referring first to FIGS. 1 to 4, the exterior of the surface-mount package of the preferred embodiment of the invention is shown, and consists of a molded insulation plastic housing 30 which is an elongated rectangle and incorporates the upper surfaces and portions of the edges of a flat single gauge lead frame which may be a conventional copper alloy about 1.27 mm thick. In a preferred embodiment, housing 30 is about 29 mm long, 14.2 mm wide, and 4.27 mm high. The lead frame is described in more detail below with reference to FIGS. 6, 7 and 8. The lead frame elements shown in FIGS. 1 to 4 are lead frame heat sink pad 31, power terminals 32 and 33 on the corners of one edge of the rectangular housing 30 and control terminals or pins 34, 35 and 36 along the opposite side of housing. Terminals 32 to 36 extend about 1 mm beyond the ends of the housing. Terminals 34 and 35 are preferably closely spaced, for example, about 2.5 mm center to center while terminals 35 and 36 are preferably more widely spaced, for example, about 6.0 mm center to center.

As shown in FIG. 3, the bottom surfaces of pad 31 and terminals 32 to 36 are co-planar and are capable of connection to the patterned surface of a heat sink support such as an IMS board. FIG. 5 shows a cross-section of a typical IMS board which consists of a thick thermally conductive (copper or aluminum alloy) substrate 40 which is covered with a very thin insulation polymer 41. A patternable thin conductive solderable layer 42 is disposed atop insulator 41. Any desired pattern can be formed in layer 42 but, in FIG. 5, the layer 42 is separated into a portion 42a and a plurality of segments aligned with terminals 32 to 36. Only segments 42b and 42c, which align, for example, with terminals 32 and 34 respectively, are shown in FIG. 5. It then becomes convenient to solder down the bottom of the package of FIGS. 1 to 4 to the IMS board of FIG. 5, using standard soldering techniques.

To assist and improve the solder-down operation, flux washing grooves 50 and 51 (FIGS. 2 and 3) are formed across the bottom of plastic housing 30 between and parallel to the opposite edges of pad 31 and the lines of terminals 32–33 and 34–36 respectively. Grooves 50 and 51 preferably have a curved cross-section and a radius of about 0.4 mm. These grooves are very useful to assist in washing away solder flux after the solder down operation, and further increase the tracking distance over the plastic surface between pad 31 and terminals 32 to 36.

Figure 10:
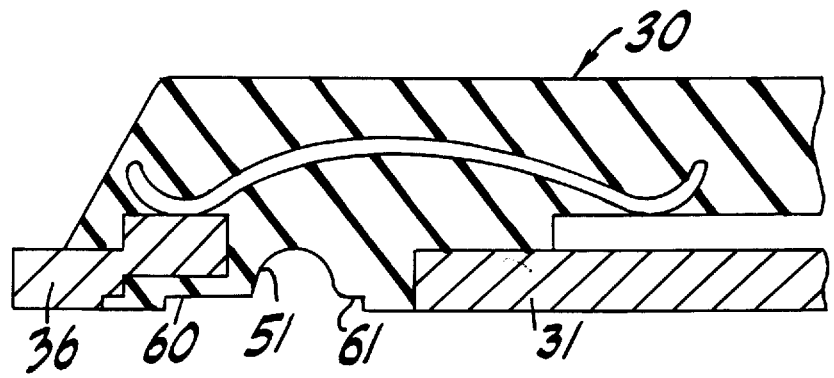
FIG. 10 is an enlarged detail of circled region "B" in FIG. 3 showing the locking of a control terminal into the plastic housing and the novel washing groove structure.

In order to improve the flux washing function, it was found useful to provide shallow short shelves, shown as shelves 60 and 61 in FIG. 10. Shelves 60 and 61 have a depth of about 0.1 mm, and ensure that their respective washing grooves 50 and 51 are spaced and open above the substrate to which the package is soldered.

Figure 6:
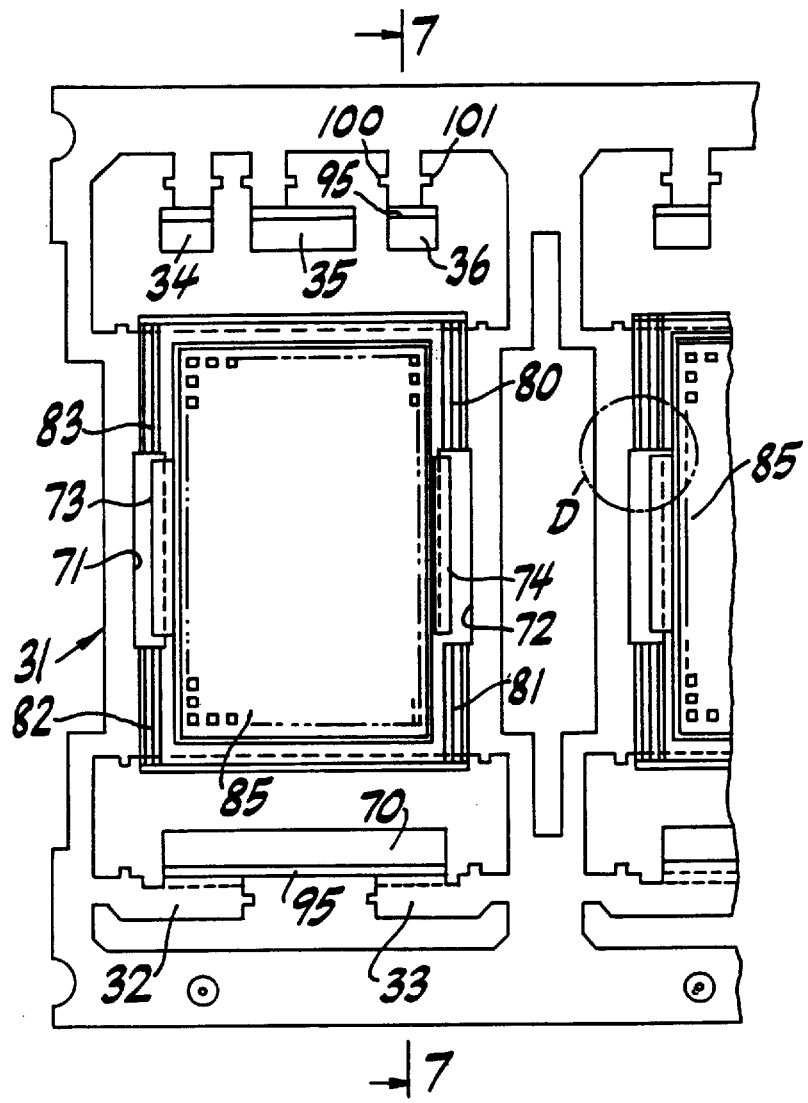
FIG. 6 is a top view of the lead frame used in the package of FIGS. 1 to 4.
Figure 7:
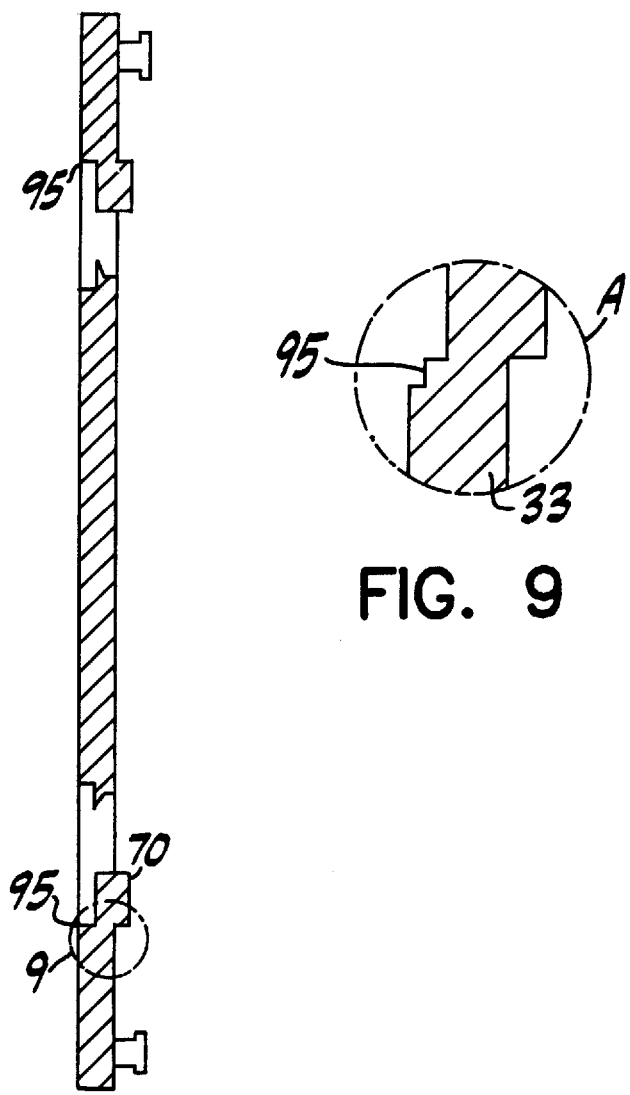
FIG. 7 is a cross-sectional view of FIG. 6 taken across section line 7—7 in FIG. 6.
Figure 8:
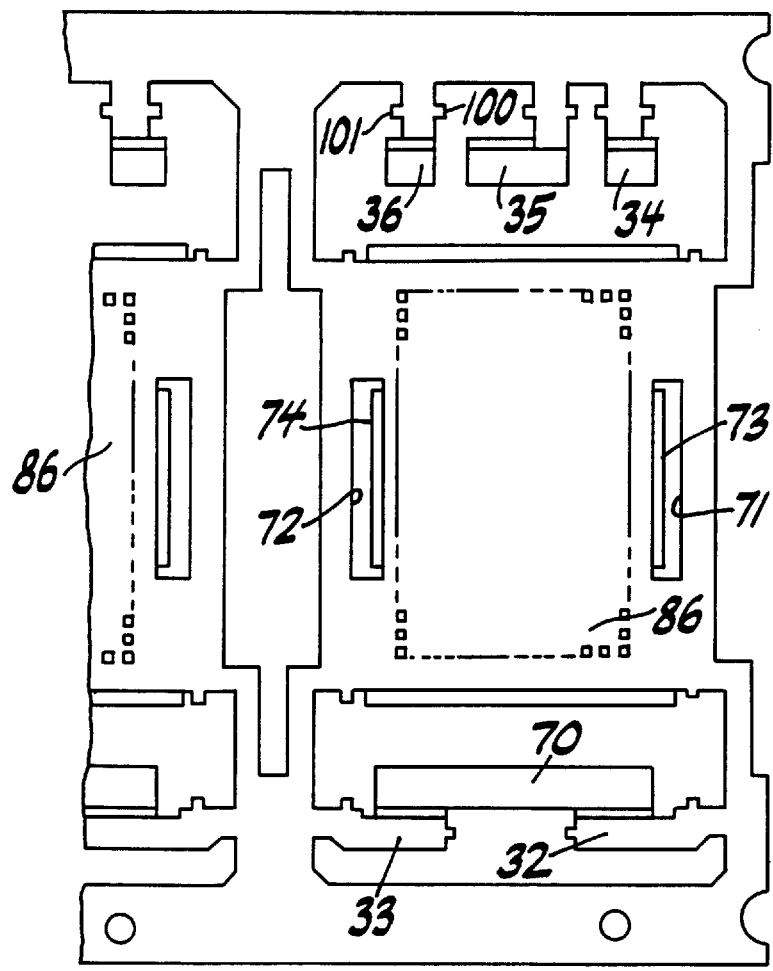
FIG. 8 is a bottom view of the lead frame of FIG. 6.

The lead frame itself, before receiving die or a housing, is shown in FIGS. 6, 7 and 8. The pad 31 and terminals 32 to 36 are integral parts of the lead frame and are joined by segments which are cut away after over-molding to isolate contacts 34 to 36 from contacts 32, 33 and from the pad 31 and from one another. The lead frame also contains a heavy cross bar 70 (FIGS. 6 to 8 and 18) which connects power terminals 32 and 33 together, and further acts as a plastic lock to help anchor the lead frame into plastic housing 30. Bar 70 also serves as a bonding surface for wire bonds, as will be described in connection with FIGS. 18 and 19.

Pad region 31 has two parallel thin slots 71 and 72 (FIGS. 6 to 8, 14 and 15) which fill with plastic during the molding operation, also creating a plastic lock, to help lock pad 31 to housing 30. Intentional short barbs 73 and 74 extend from the interior walls of slots 71 and 72, respectively, creating yet another plastic lock, to further anchor the lead frame pad 31 to the plastic housing.

In order to still further assist as a plastic lock, dovetail grooves 80 to 83 (FIGS. 6, 14 and 15) extend from the ends of slots 71 and 72 on the top surface of pad 31 toward the ends thereof. These fill with plastic during the molding operation to further lock pad 31 to the housing.

It will be noted that the top central surface of pad 31 has a "waffled" surface 85. The top surface of pad 31 may be nickel plated and has a pattern of shallow (preferably about 0.05 mm) spaced indentations, preferably dot-shaped indentations of about 0.25 mm diameter on about 0.6 mm centers. It is known that this waffle pattern improves the solder down of die to the waffled surface. In accordance with another aspect of the preferred embodiment of the invention, the opposite side of the pad 31 is also provided with a waffle pattern 86 (FIG. 8). This surface is ordinarily flat and smooth, but it has been found that if the surface is slightly concave, undesirable solder voids can be formed during the solder-down process. In accordance with the invention, a waffle pattern on the bottom of the concave lead frame surface improves its ability to be soldered to a flat heat sink surface by increasing the wetting and flow of solder therebetween.

Figure 11:
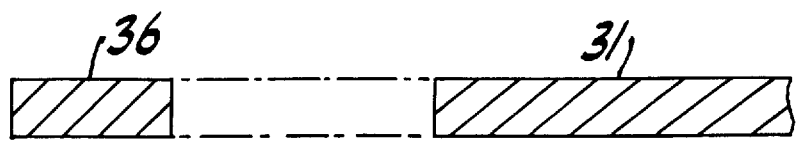
FIG. 11 shows a portion of the flat single gauge lead frame of the preferred embodiment of the invention without terminal lead offset.
Figure 12:
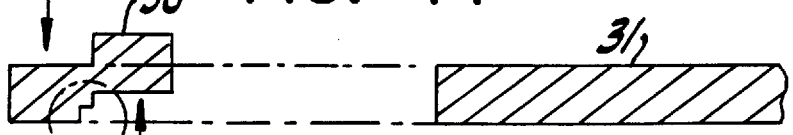
FIG. 12 shows the lead frame of FIG. 11 after offsetting of the terminal leads.
Figure 13:
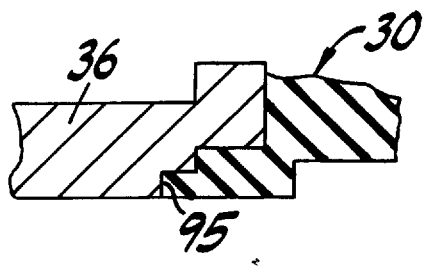
FIG. 13 shows the formation of a stepped corner at corner region "C" in FIG. 12 to prevent plastic bleeding over the bottom surface of the terminal during molding.
Figure 14:
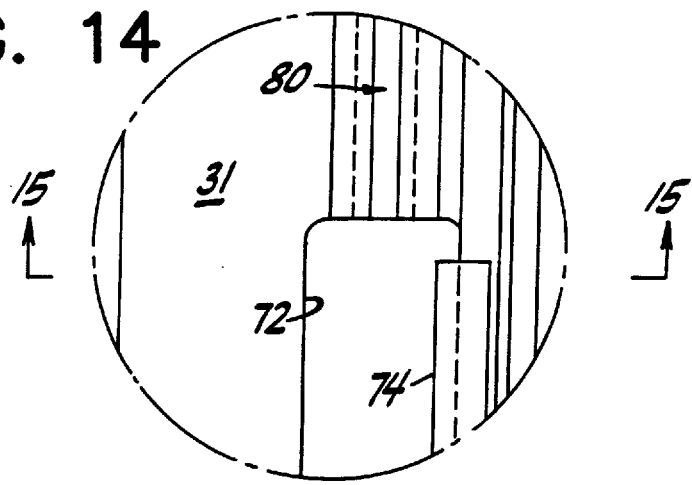
FIG. 14 is an enlargement of circled region "D" in FIG. 6 and shows a plastic lock groove extending from the end of the plastic lock slot in the lead frame.
Figure 15:
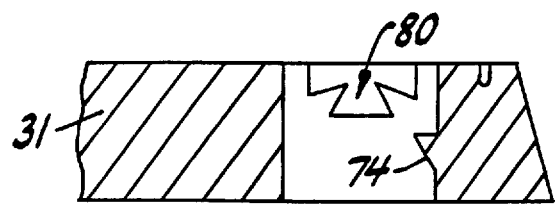
FIG. 15 is a cross-section of FIG. 14 taken across section line 15—15 in FIG. 14.

FIG. 11 shows a cross-section of a portion of the lead frame containing pad 31 and contact 36. This frame is originally a perfectly flat frame with flat planar top and bottom surfaces. It was found that, by slightly displacing the terminal sections of the lead frame by a partial stamping operation as shown in FIG. 12, the terminals are better locked into the plastic housing 30. The actual displacement used is about 0.5 mm for a 1.27 mm thick lead frame. It was found that during the molding operation (after this offsetting process), plastic tended to bleed past the slightly rounded edge at location "C" in FIG. 12, over the bottom surface of terminal 36 and over the other off-set terminals 32 to 35. It was found that the stamping of a square notch 95 (FIG. 9 and 13) at the corner "C" in each terminal prevented this undesired bleeding of plastic. The notch 95 is preferably formed by shearing the material (as opposed to bending) because such a method requires no additional lateral space.

Notch 95 is about 0.2 mm deep and 0.3 mm long. Notch 95 is shown in FIGS. 6 and 7 for each of the offset terminals 32 to 36.

Figure 16:
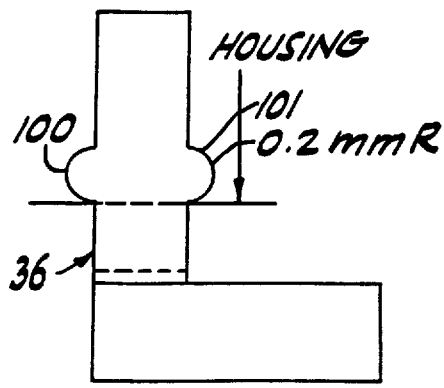
FIG. 16 is a top view of a severed lead frame terminal and shows sacrificial vertical crushable bumps or beads on the sides of the terminal which seal the mold tool to prevent bleeding of the plastic onto the exposed solderable surface of the terminal.
Figure 17:
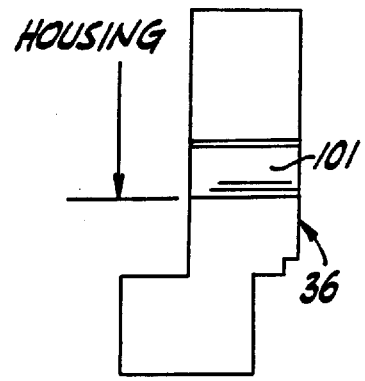
FIG. 17 is a side view of FIG. 16.

As a still further feature of the novel package, each of the pins or terminals extending through the plastic housing 30 has one or more small beads extending from the thickness of the terminal. The thickness of the beads 100, 101 should vary in accordance with the thickness of the lead frame. In general, the beads 100, 101 will be from 0.05 to 0.5 mm thick. Thus, as shown in FIGS. 16 and 17, two crushable beads 100 and 101, having radii, for example, of about 0.2 mm (for a lead frame of 1.2 mm), serve to be crushed or partly flattened by a molding tool to prevent the bleeding of plastic beyond the boundary defined by the beads 100 and 101. The crushable beads are shown in FIGS. 6 and 7 at all necessary locations on the lead frame.

FIGS. 16, 17 and 20 to 24 show added detail with respect to the crushable beads 100 and 101 on illustrative terminal 36. Thus, referring to FIG. 20, it was found that, during molding of housing 30, there was an uncontrolled flow of a thin sheet of plastic 120, 121 on the sides of the terminals, such as terminal 36 outside the mold housing 30. This plastic must be removed since it interferes with soldering to terminal 36.

Figure 21:
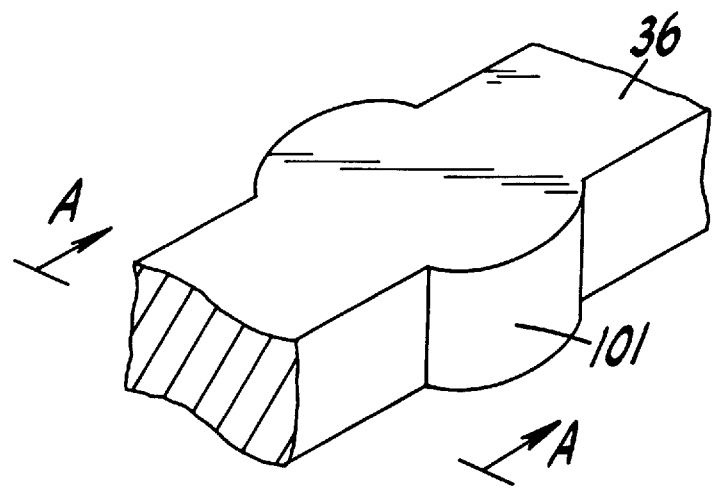
FIG. 21 shows the terminal of FIG. 20 in perspective view with sacrificial protrusions.
Figure 22:
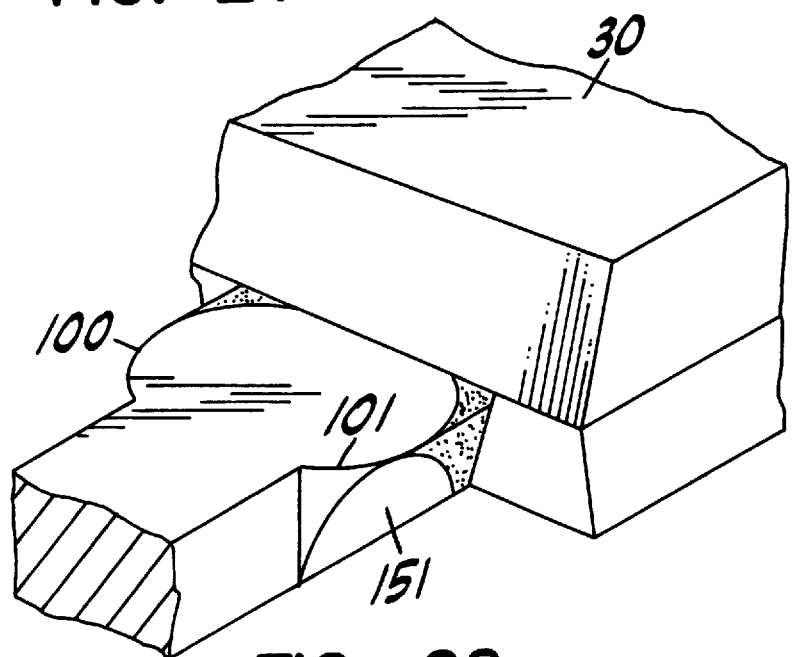
FIG. 22 shows the sacrificial protrusions after molding.

This problem was solved by the crushable beads 100 and 101, shown in FIGS. 16, 17 and 21, on the sides of terminal 36. Thus, during molding, beads 100 and 101 are crushed by the mold, as shown in FIG. 22 to act as a dam against the outward leakage or bleeding of plastic, as shown. It will be noted that trapezoidal flats are crushed into beads 100 and 101. Thus, as shown in FIGS. 23 and 24, the mold 140 has a tapered channel portion 141 which receives the terminal 36. As the mold closes from the position of FIG. 23, terminal 36 is forced into the tapered channel 141 which flattens the beads 100 and 101 with flats 150 and 151 respectively. Thus, during molding, the crushed beads seal channel 141 to prevent bleeding of plastic past the crushed regions of beads 100 and 101. The divergent angle of channel 141 permits the easy release of terminal 36 (and of all terminals 32 to 36) after molding is completed as in FIG. 24.

Figure 18:
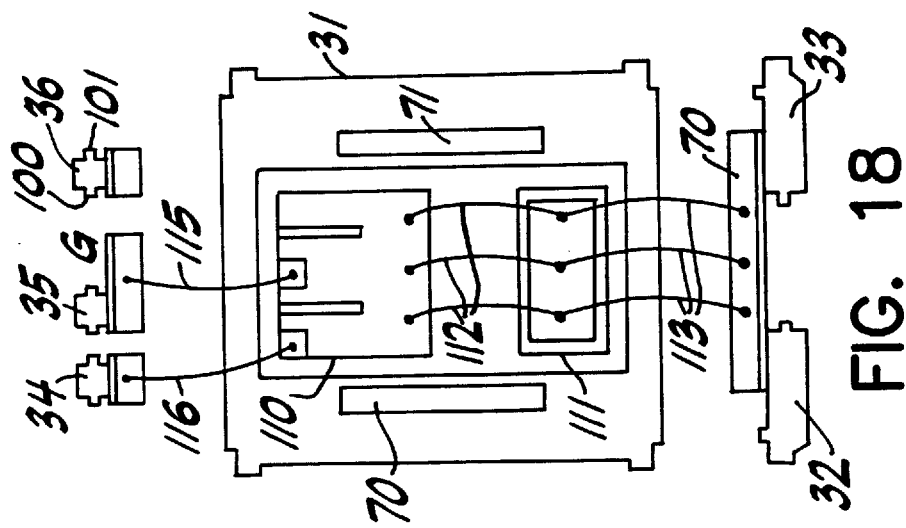
FIG. 18 shows the lead frame of FIG. 6 with semiconductor die soldered down to the pad and bonding wire connecting the die to external terminals, and shows the manner in which the lead frame is trimmed after the molded housing (not shown) is formed.

FIG. 18 shows the lead frame pad 31 after two semiconductor device die 110 and 111 have been soldered down to pad 31, called a copack. Die 110 and 111 of the copack may be of any type, but are shown in FIG. 18 and 19 as a power IGBT and a fast recovery diode (FRED), respectively.

Figure 19:
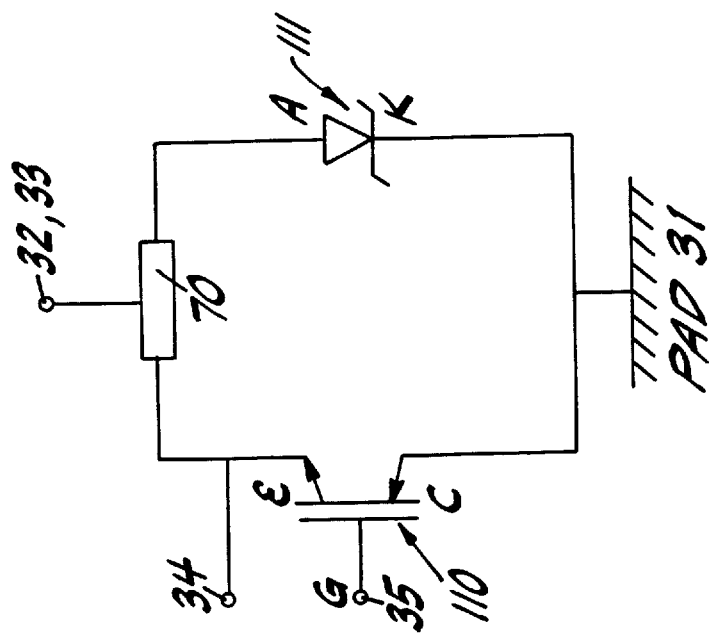
FIG. 19 shows a circuit diagram of FIG. 18.

It is noted that in FIG. 19 the collector electrode of IGBT 110 is connected to the cathode of FRED diode 111 because those electrodes are soldered to and connected by conductive pad 31. Thus, the conductive pad 31 provides a means for electrically interconnecting the copack to an external circuit. The top emitter electrode of IGBT 110 is wire bonded, as by wires 112 to the anode electrode of FRED diode 111. Wire bonds 113 continue and are connected to cross bar 70 and terminals 32, 33.

Further, a wire bond 115 is made from the gate pad of IGBT 110 to gate terminal 35 and an emitter Kelvin connection 116 may also be provided at terminal 34 as shown in FIG. 18.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A surface mount semiconductor device package, comprising:

a semiconductor device;

a metal pad on which the semiconductor device is mounted;

a housing formed of a flowable material which bonds to the metal pad and encapsulates the semiconductor device when it cures;

at least one terminal being spaced away from and co-planar with the metal pad, the terminal having spaced apart side surfaces which define a thickness of the terminal; and at least one crushable bead disposed on each side surface of the terminal, each bead having a thickness corresponding with the thickness of the terminal and being sized and positioned such that a portion thereof is deformed by and conforms to a channel of a molding device when it receives the terminal to form the housing, the bead preventing the flowable material of the housing from bleeding into the channel of the molding tool.

2. The surface mount semiconductor device package of claim 1, wherein the package includes a plurality of terminals, each terminal having a crushable bead on each side surface thereof.

3. The surface mount semiconductor device package of claim 2, wherein at least one crushable bead on one of the terminals is axially aligned with at least one crushable bead on the other terminals which are located on one side of the package.

4. The surface mount semiconductor device package of claim 3, wherein the crushable bead is from about 0.05 to 0.5 mm thick.

5. The surface mount semiconductor device package of claim 1, wherein the crushable bead includes a rounded portion having a radius of about 0.2 mm.

6. The surface mount semiconductor device package of claim 1, wherein the crushable bead includes a trapezoidal flat formed by the channel of the molding device when it deforms the bead.

7. The surface mount semiconductor device package of claim 6, wherein the molding device has a tapered channel portion which receives the terminal and the bead and flattens the bead when the mold closes.

* * * * *